(12) United States Patent
Fry

(10) Patent No.: US 8,372,482 B2
(45) Date of Patent: Feb. 12, 2013

(54) METHODS AND APPARATUS FOR CONTROLLED CHEMICAL VAPOR DEPOSITION

(75) Inventor: Vincent Fry, Duarte, CA (US)

(73) Assignee: Goodrich Corporation, Charlotte, NC (US)

( * ) Notice: Subject to any disclaimer, the term of this patent is extended or adjusted under 35 U.S.C. 154(b) by 877 days.

(21) Appl. No.: 12/395,414

(22) Filed: Feb. 27, 2009

(65) Prior Publication Data

US 2010/0221427 A1    Sep. 2, 2010

(51) Int. Cl.
  *B23P 19/10*    (2006.01)
  *C23C 16/00*    (2006.01)
(52) U.S. Cl. ..................... 427/255.28; 29/525
(58) Field of Classification Search ............ 427/255.28; 29/525

See application file for complete search history.

(56) References Cited

U.S. PATENT DOCUMENTS

| 2004/0025786 A1 | 2/2004 | Kontani et al. |
| 2005/0287806 A1* | 12/2005 | Matsuura ................ 438/680 |
| 2008/0090192 A1* | 4/2008 | Dane et al. ................ 431/354 |

FOREIGN PATENT DOCUMENTS

| DE | 102007024798 | 11/2007 |
| EP | 1820434 | 8/2007 |
| GB | 778611 | 7/1957 |
| JP | 52149064 | 12/1977 |

OTHER PUBLICATIONS

Preliminary Search Report dated Aug. 28, 2012 in French Application No. 0959644.

* cited by examiner

*Primary Examiner* — Leo B Tentoni
(74) *Attorney, Agent, or Firm* — Snell & Wilmer L.L.P.

(57) ABSTRACT

A gas injector system is provided that allows for improved distribution and directional control of the vapor material in a CVD or CVI process. Gas injector systems may be used without experiencing significant clogging of gas injector tube apertures over multiple CVD procedures. Further, a gas injector system include a dual aperture release system and/or allow vapor material to flow both substantially horizontally and substantially vertically.

4 Claims, 18 Drawing Sheets

METHODS AND APPARATUS FOR CONTROLLED CHEMICAL VAPOR DEPOSITION

FIELD OF INVENTION

The present invention relates to chemical vapor infiltration (CVI) and chemical vapor deposition (CVD), more particularly, apparatus and methods for gas injectors used in conjunction with CVD/CVI and gas injector systems that have extended useful lives.

BACKGROUND OF THE INVENTION

Chemical vapor infiltration (CVI) and chemical vapor deposition (CVD) are well-known processes for forming composite materials. CVI/CVD are particularly useful processes for fabricating structural composites such as brake disks, combustors and turbine components, and CVD/CVI are also used to fabricate various semiconductor products and other electronic parts. In general, the term CVI implies deposition of a matrix within the pores of a substrate, and the term CVD implies deposition of a surface coating on a substrate. However, as used herein, both terms are intended to refer generally to infiltration and/or deposition of a material on or within a substrate.

In general, CVD is a process of subjecting a substrate to a material in vapor form, resulting in a deposition of the material on the substrate. CVD may be performed at various temperatures and pressures, and for various periods of time. In many applications, CVD is performed at high temperatures and under low pressures, including under a vacuum or near vacuum. To facilitate high temperatures, CVD may be performed in a furnace or other suitable vessel. In many applications, CVD is performed on multiple substrates concurrently for economic and efficiency reasons. To facilitate uniform application of vapor material onto a substrate, the flow rate, direction, duration, and dispersion of the vapor material may be controlled.

CVD may be used to deposit material onto substrates of various shapes and configurations, including annular disks. In such applications, the vapor material (i.e., chemicals in gaseous form) may be released into the vessel via a central tube that is disposed perpendicular to the surface of the annular disks. Vapor material is released into a vessel using various methods. In conventional systems, gas is released through nozzles or holes that are typically located on a central tube or on a plate in the vessel.

However, there are disadvantages associated with such conventional systems and methods for performing CVD. For example, using conventional CVD processes, the temperature and pressure gradients may vary at different locations within the process vessel, causing the rate and amount of deposition of the vapor material to vary from substrate to substrate, dependent upon the location of the substrate within the process vessel. In some conventional systems, vapor material release is poorly controlled and may not be uniformly applied to the substrate. For example, exit apertures may become clogged. Although in some instances, a clogged tube may be re-machined to unclog the holes, in many cases, replacement of the tube is necessary, limiting the useful life of the tube. Accordingly, there is a need for gas injection systems that provide better control and distribution of vapor material in CVD processes and for gas injection systems that may be reused more readily.

SUMMARY OF THE INVENTION

A gas injector system improves distribution and directional control of the vapor material in a CVD or CVI process. Gas injector systems in accordance with various embodiments may be used without experiencing significant clogging of gas injector tube apertures over multiple CVD procedures. Further, various embodiments include a dual aperture release system and/or allow vapor material to flow both substantially horizontally and substantially vertically.

For example, various embodiments include a system comprising a gas injector tube having at least one tube aperture disposed therethrough, a shield collar having at least one collar aperture at least partially corresponding to the tube aperture, wherein the shield collar is configured such that the tube aperture at least partially aligns with the collar aperture.

A method comprises forming a gas injector tube having at least one tube aperture disposed therethrough, forming a shield collar having at least one collar aperture at least partially corresponding to the tube aperture, wherein the shield collar is configured such that the tube aperture at least partially aligns with the tube aperture, and coupling the shield collar with the gas injector tube.

Further, a system comprises a first gas injector tube having a first exterior surface, a second gas injector tube having a second exterior surface, a shield collar having a plurality of collar apertures, wherein the first gas injector tube and the second gas injector tube are configured to be substantially coaxially aligned at a tube joint, wherein the shield collar is configured to cover a portion of the first exterior surface and a portion of the second exterior surface, and wherein the tube joint comprises a gap between the first gas injector tube and the second gas injector tube.

DETAILED DESCRIPTION

Figure 1A:
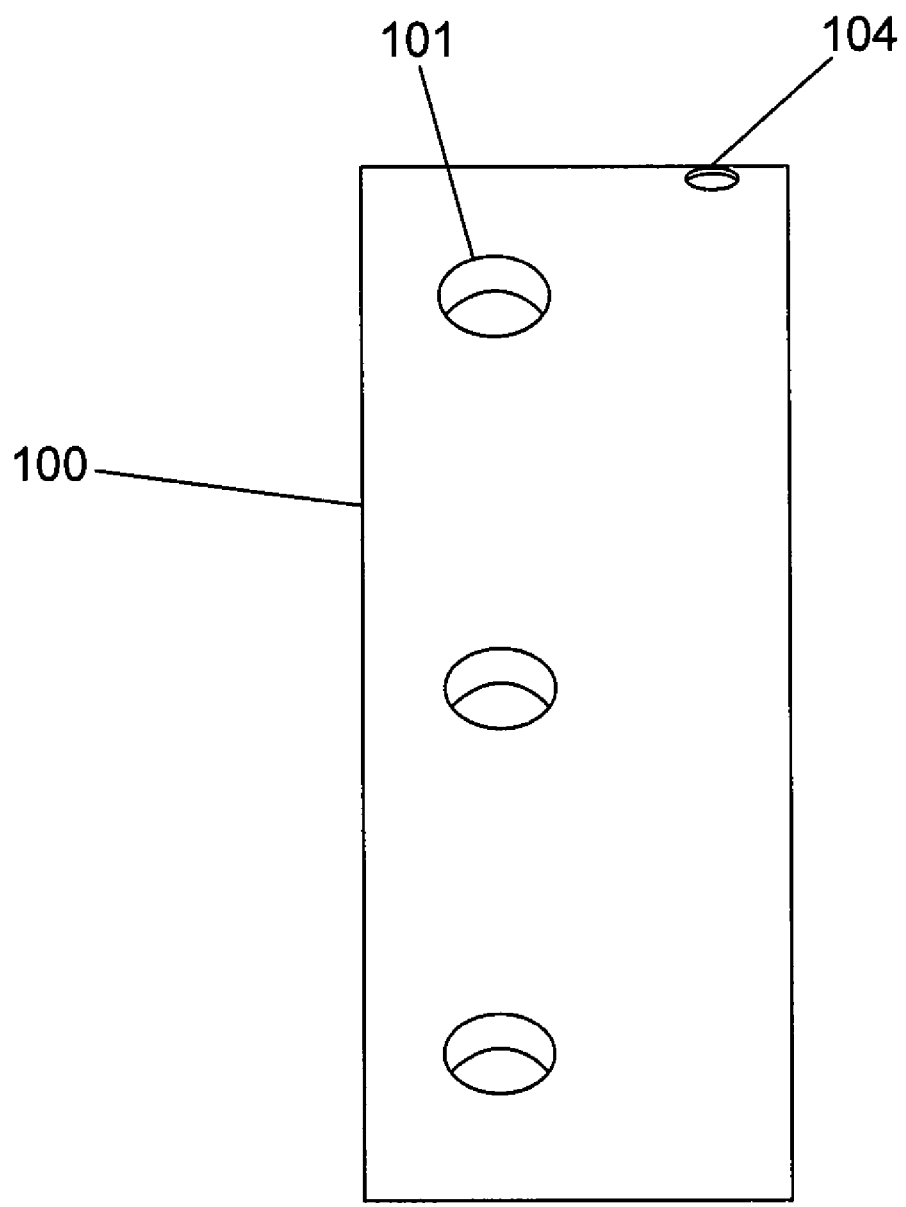
FIGS. 1A and 1B illustrate a shield collar in accordance with an embodiment.

The detailed description of exemplary embodiments herein makes reference to the accompanying drawings, which show exemplary embodiments by way of illustration and its best mode, and not of limitation. While these exemplary embodiments are described in sufficient detail to enable those skilled
} in the art to practice the invention, it should be understood that other embodiments may be realized and that logical, chemical and mechanical changes may be made without departing from the spirit and scope of the invention. For example, the steps recited in any of the method or process descriptions may be executed in any order and are not necessarily limited to the order presented. Moreover, many of the functions or steps may be outsourced to or performed by one or more third parties. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

In various embodiments, the injection of gas into a vessel in a CVD process (also referred to herein as chemical vapor or vapor material) is accomplished without significant clogging of the gas injector tube apertures over one or more CVD procedures. Clogging may be inhibited by using a multiple aperture release system, wherein gas is injected through successive apertures of varying sizes. For example, a dual aperture release system may comprise a more readily reusable component having a plurality of apertures and a potentially less reusable component having a plurality of apertures. The reusable component may have apertures that are larger than the apertures of the less reusable component. Where there are a plurality of apertures disposed on both the reusable component and the less reusable component, the total surface area of the reusable component's apertures may be less than the total surface area of the less reusable component's apertures. The readily reusable component's larger apertures may inhibit clogging of the component, thereby enhancing the components useful life. The less reusable component's smaller apertures may allow for directional and pressure control of the gas. As the less reusable component may be smaller and more inexpensively fabricated than the reusable component, the cost of multiple CVD/CVI processes is diminished. In various embodiments, a readily reusable component is a gas injector tube. In various embodiments, the less reusable component is a shield collar.

In various embodiments, the injection of gas into a vessel in a CVD process is generally directionally controlled. Directional control comprises the distribution of gas in both a substantially horizontal and substantially vertical direction. Directional control may also comprise the distribution of gas in one or more directions other than horizontal or vertical. A multidirectional flow component may comprise apertures disposed such that a fluid flowing through the apertures may be directionally controlled. For example, a shield collar may be a multidirectional flow component.

CVD may be used to deposit material onto a variety of substrates, including semiconductors and composite materials. For example, CVD may be used with carbon fiber composite materials. CVD may be performed at temperatures from about 500° F. to about 4000° F. CVD may be performed at pressures from about 0 kPa to about 100 kPa. The injection of gas into a vessel in a CVD process may be accomplished using one or more methods. For example, a tube may be used to conduct gas into a furnace or other vessel. Any suitable furnace or other vessel may be used. Further, any arrangement of the tube (or tubes) within the vessel is contemplated. When CVD is used with substrates comprising annular or circular disks, a tube may be disposed substantially coaxial to the annular disks. In various embodiments, a stack of substrates may be grouped together in several groups and arranged in the vessel such that each group is at least partially separated by a plate. The plates used may be solid or they may have a variety of apertures that may allow gas to permeate through the plate.

Referring to FIGS. 1-11B, in various embodiments, a gas injector tube may be used. A gas injector tube may be any tube or pipe capable of conducting gas into a vessel. The gas injector tube may be a hollow cylindrical structure, although other geometries may also be used. A gas injector tube may be of any length, width, or height suitable to its particular application. Injectors may be pipes or chambers. Chambers may be constructed from flat plates or other geometries in various configurations. The chambers may include the vessel walls as part of the chamber. For example, with reference to FIGS. 11A and 11B, one or more flat plates may be installed against a cylindrical furnace wall forming a chamber 1101 between the at least one plate and the wall. Flat plate 1101 may have aperture 1102. Generally, a tube or chamber dimension may be scaled to vessel size and length. A tube ID or OD may range from about 1/64 inch to about 24 inches. A gas injector tube may be constructed of any suitable material that is capable of withstanding typical CVD temperatures and pressures. For example, a gas injector tube may be constructed of steel, iron, aluminum, and/or a carbon material such as graphite. In various embodiments, a gas injector tube is constructed of graphite.

As noted above, in various embodiments, a gas injector tube 200 is a hollow cylindrical structure. In such embodiments, the walls of the cylindrical tube may be of any suitable thickness. For example, the walls of a cylindrical gas injector tube 200 may be from about 1/64 of an inch thick to about 6 inches thick. In various embodiments, the walls of a cylindrical gas injector tube may be from about 4/32 of an inch thick to about 1/2 of an inch thick. In other applications, the walls of a cylindrical gas injector tube may be 9/32 of an inch thick. At one or both of the terminal ends of the gas injector tube, cap apertures may be machined. As described below, cap apertures 202 suitably allow the attachment of an end cap or flanged sleeve. Cap apertures may be of any suitable diameter. For example, cap apertures may range from about 1/64 of an inch to about 24 inches. In various embodiments, a gas injector tube has a plurality of apertures disposed therethrough. For example, gas injector tubes 103, 200, 500 and 301 have gas injector tube apertures 105, 201, 501 and 304. The plurality of apertures may be disposed in any pattern on the tube. For example, the apertures may be disposed about a common circumference of the gas injector tube. The apertures may also be staggered with respect to a common circumference of the gas injector tube. The apertures may be of any suitable geometry, including circular, quadrilateral, octagonal, or any other geometry. The apertures may be formed using any process suitable for manufacturing or machining the material that comprises the gas injector tube. For example, the apertures may be formed by drilling, etching, mortising, chiseling, stamping, and/or forging. In various embodiments, the apertures are machined into a graphite gas injector tube using a drill.

The apertures may be of any size or diameter. In various embodiments, the size of the gas tube aperture is selected so that after multiple uses, the gas injector tube aperture is less prone to clogging. Apertures may range from about 1/64 of an inch in diameter (approximately 0.39 mm) to about 2 inches (approximately 50.8 mm) in diameter. It is understood that aperture size may be expressed as the diameter of a circle but also along any side axis of the geometric shape chosen for the aperture. Apertures of about 9/32 of an inch (approximately 7.14 mm) may be used. In another application, apertures of about 3/8 of an inch (approximately 9.52 mm) may be used. In still other applications, apertures of about ¼ of an inch (approximately 6.35 mm) may be used.

In various embodiments, a shield collar is used in conjunction with a gas injector tube. A shield collar includes any structure that may be coupled to a gas injector tube. As used herein, "coupling" means the shield collar fits around or over a gas injector tube. A shield collar may take the form of a hollow cylindrical structure and/or may further comprise a hollow cylindrical structure having concentric hollow cylinders. Concentric hollow cylinders may be formed where a single hollow cylindrical structure is comprised of one or more sub-cylinders having a different radius.

Figure 1B:
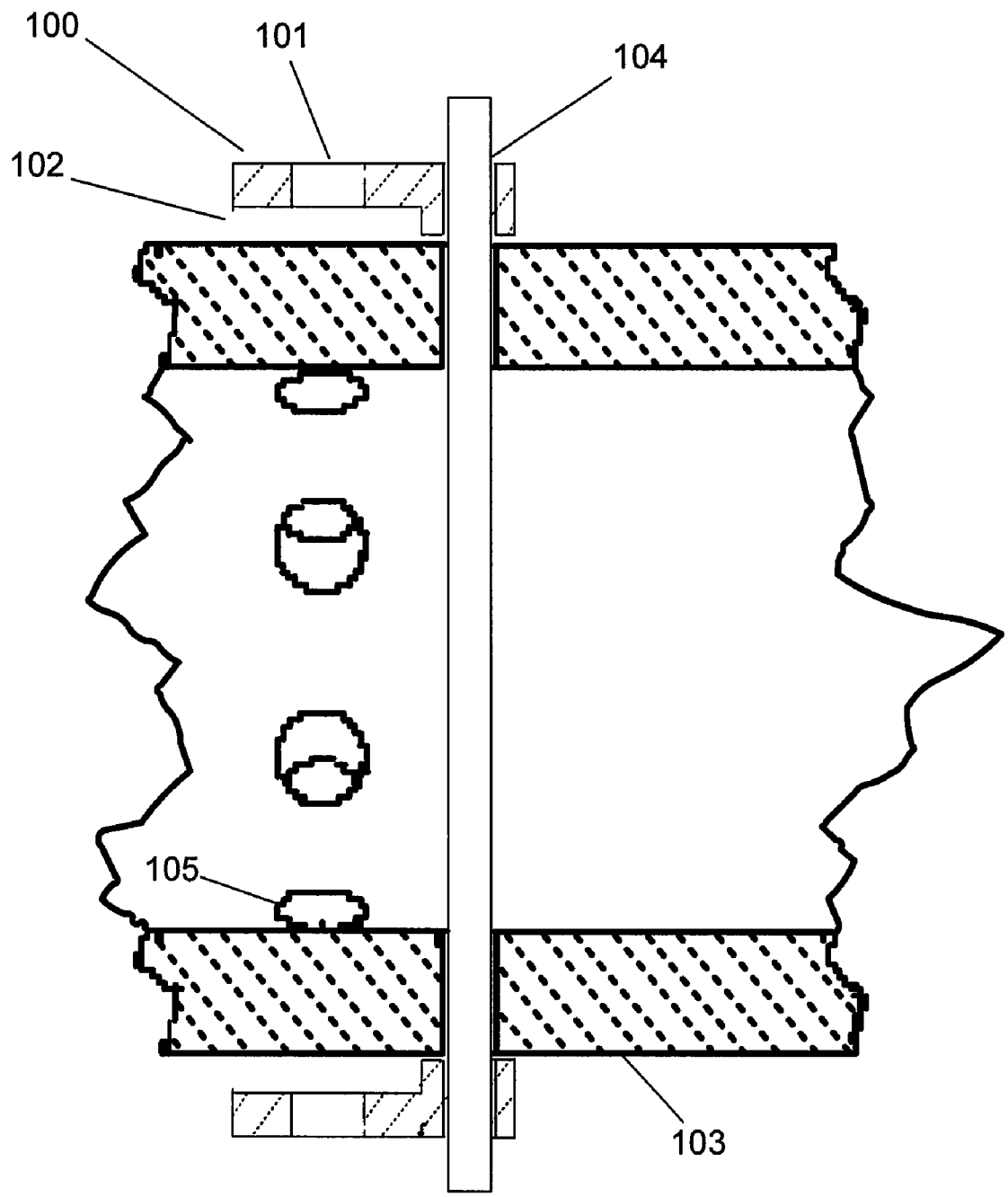
Figure 2:
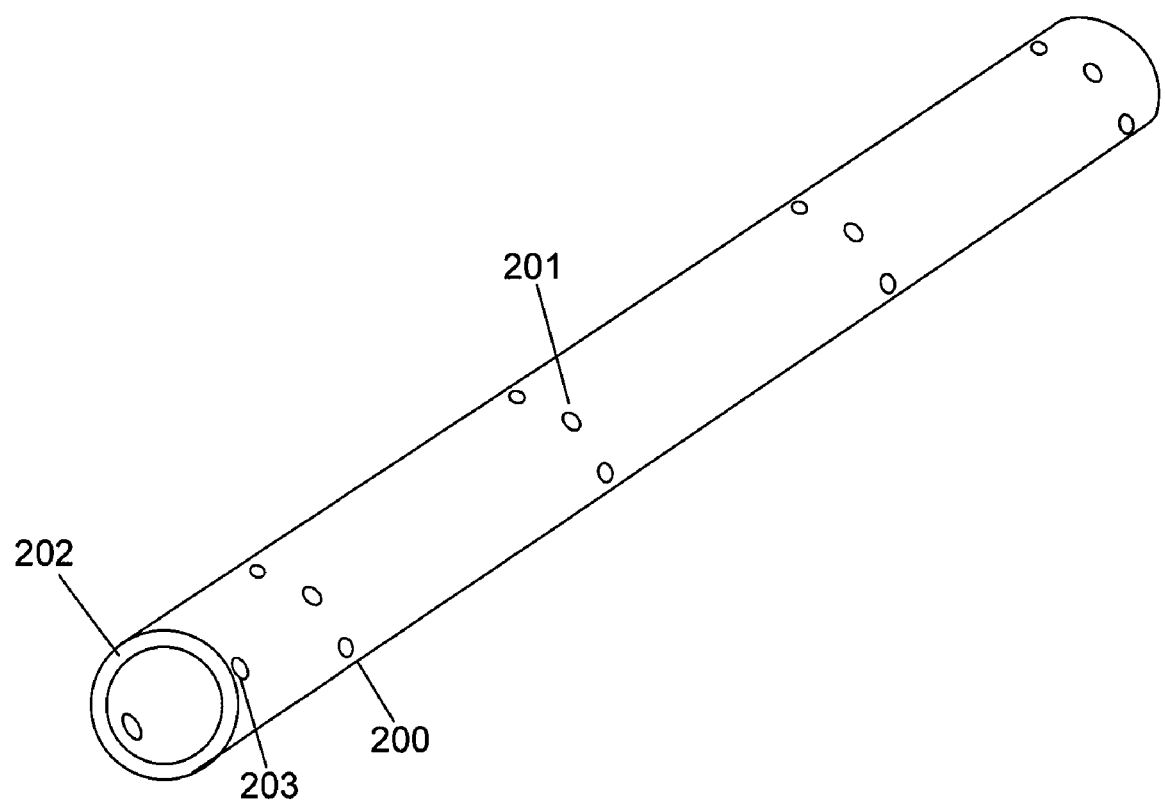
FIG. 2 illustrates a gas injector tube with a plurality of tube apertures in accordance with an embodiment.

A shield collar may be constructed of any material that is also suitable for use in a gas injector tube. With references to FIGS. 1A, 1B, 3A, and 3B, shield collar 100 and 300 is a hollow cylindrical structure and comprises concentric hollow cylinders. In such embodiments, the walls of the cylindrical tube may be of any suitable thickness. For example, the walls of a cylindrical shield collar 300 may be from about 1/64 of an inch thick to about 6 inches thick. In the embodiment of FIGS. 1A and 1B, the walls of a cylindrical shield collar are about ⅛ of an inch. In various embodiments, the walls of a cylindrical shield collar are about ¼ of an inch thick.

In various embodiments, the shield collar includes a plurality of apertures disposed therethrough. The plurality of apertures may be disposed in any pattern on the shield collar. For example, the apertures may be disposed about a common circumference of the shield collar. The apertures may also be staggered with respect to a common circumference of the shield collar. The shield collar apertures may be disposed perpendicular to the thickness of the shield collar, similar to the apertures disposed on the gas injector tube. There may be a gap between a gas injector tube and a shield collar. With reference to FIGS. 1A, 1B, 2, 3A, and 3B, the gap 102 between the shield collar 100 and the injector tube 103 may direct fluid in a direction substantially perpendicular to aperture 101 of FIG. 1B. Similar to the gas injector tube apertures, the shield collar gap geometry may match the injector tube geometry or may be circular, quadrilateral, octagonal, or any other geometry, and may be "off center" relative to the axis of the injector tube. The axis of a shield collar aperture and the axis of a corresponding gas injector tube aperture may at least partially overlap. Gap size may be constant or may vary along the outer surface of the injector tube. In various embodiments, for example as illustrated in FIG. 1B, gap 102 is circular and constant around the circumference.

The shield collar gap may be formed using any process suitable for working with the material that comprises the shield collar.

The shield collar apertures may be of any size or diameter. Apertures may range from about 1/64 of an inch in diameter (approximately 0.39 mm) to about 2 inches (approximately 50.8 mm) in diameter. It is understood that aperture size may be expressed as the diameter of a circle but also along any side axis of the geometric shape chosen for the aperture. In various embodiments, shield collar apertures of about 9/32 of an inch (approximately 7.14 mm) may be used. In another application, shield collar apertures of about ⅜ of an inch (approximately 9.52 mm) may be used. In still other applications, shield collar apertures of about ¼ of an inch (approximately 6.35 mm) may be used. For example, apertures 101 are arranged about a common circumference of shield collar 100. Aperture 101 is disposed such that flow through the aperture would be directed radially from the axis of the shield collar. Also for example, the flow through gap 102 is directed substantially perpendicular to the flow direction of aperture 101. The gap 102 may range from about 1/64 of an inch in diameter (approximately 0.39 mm) to about 2 inches (approximately 50.8 mm). In various embodiments, a gap of 5/32 inch (approximately 4.0 mm) may be used.

In various embodiments, the shield collar may be coupled to a gas injector tube. The shield collar may couple with (attach to) the gas injector tube by fitting at least partially around or over the gas injector tube. For example, the shield collar may be disposed substantially coaxial to the gas injector tube. In various embodiments, where the gas injector tube and shield collar are cylindrical, a substantially coaxial disposition is used.

The shield collar may be fabricated to fit securely around or over the gas injector tube such that friction or a "press fit" holds the shield collar to the gas injector tube. Bonding materials, such as glue, epoxy, or various carbon materials may be used to affix the shield collar to the gas injector tube. The shield collar may be fabricated to fit securely around or over the gas tube by bolts or pins. In various embodiments, a shield collar may be coupled to a gas injector tube using a securing pin though the diameter of the shield collar and the gas injector tube. In various embodiments, securing holes are machined in a gas injector tube and shield collar to accommodate a securing pin. In other embodiments, a securing pin 302 may be inserted through a shield collar aperture and a gas injector tube aperture 303. For example, a securing pin may be inserted through shield collar aperture 104 and a gas injector tube aperture.

Figure 3A:
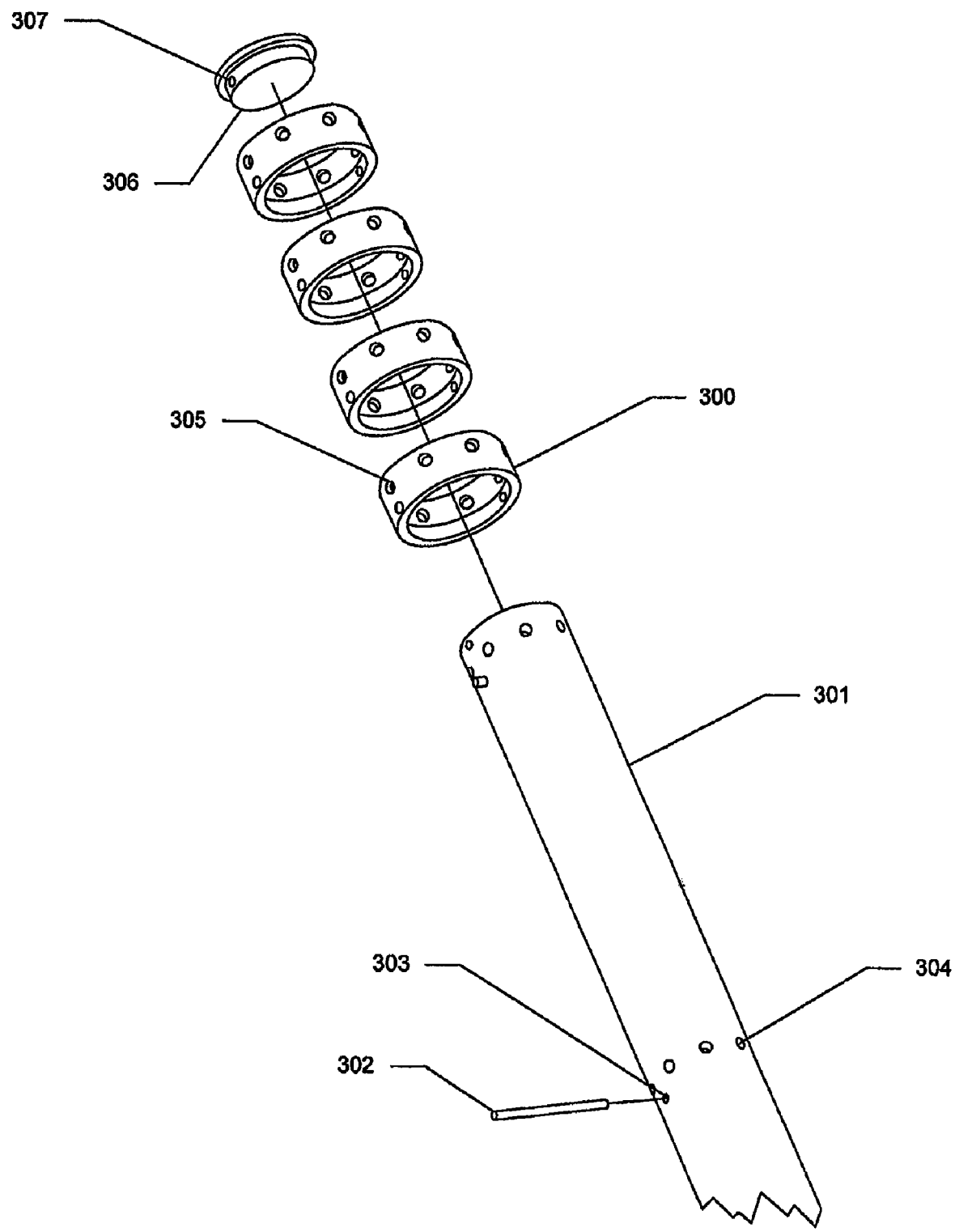
FIG. 3A illustrates a gas injector tube with separate shield collars in accordance with an embodiment.
Figure 3B:
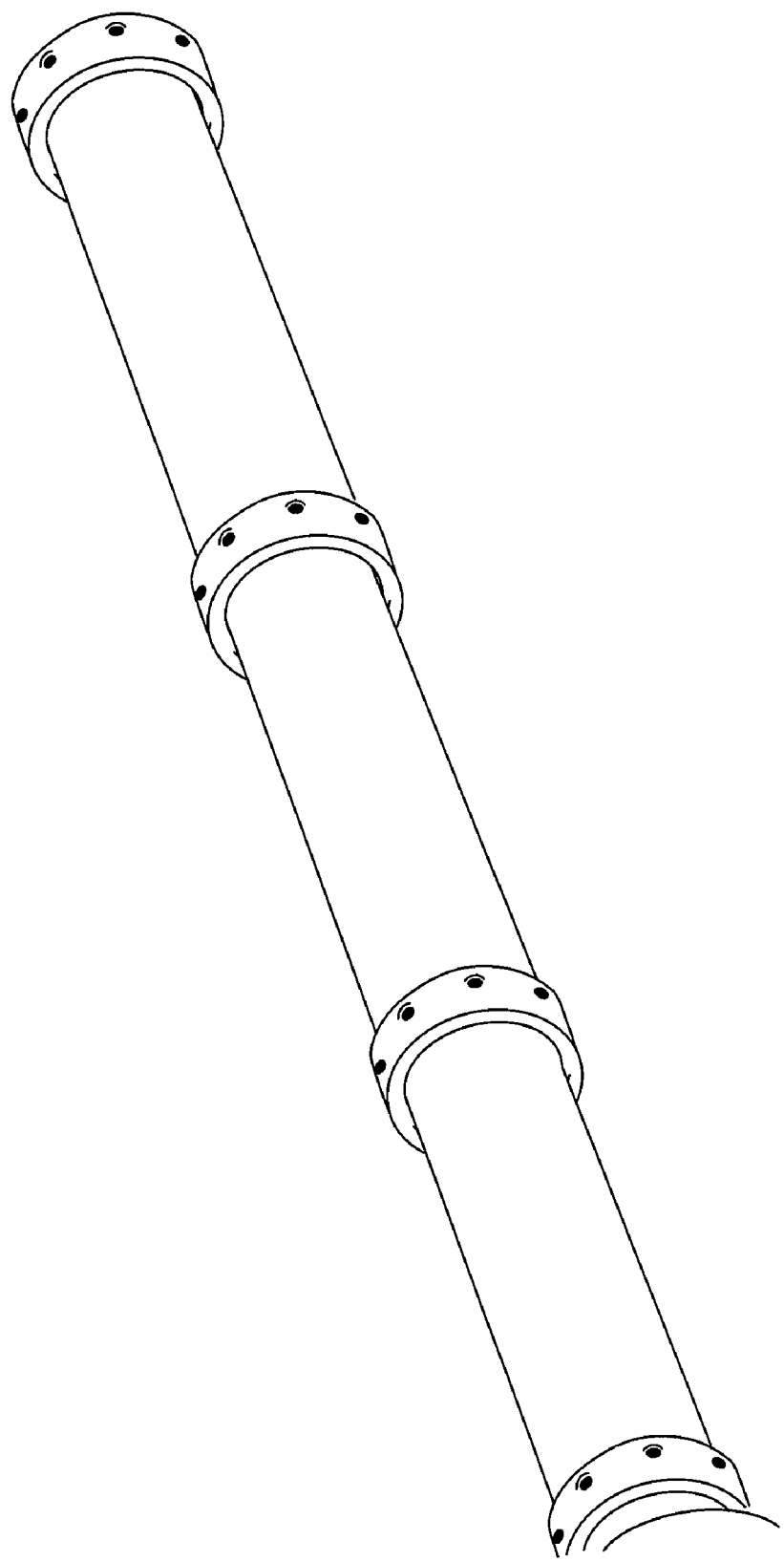
FIG. 3B illustrates a gas injector tube coupled to shield collars in accordance with an embodiment.

In various embodiments, the shield collar may be coupled with the gas injector tube such that a portion of the height of the shield collar is at least partially disposed over or around the plurality of gas injector tube apertures. For example, shield collar 300 may be disposed substantially coaxial to gas injector tube 301. FIG. 3B shows shield collar 300 having a portion of its height disposed over or around the plurality of gas injector tube apertures 304.

In various embodiments, a gap exists between a shield collar and a gas injector tube. As described here, a gap may direct fluid flow in a direction substantially perpendicular to the direction of fluid flow from a shield collar aperture. With reference to FIG. 1B, for example, gap 102 is shown between a gas injector tube and a shield collar.

In various embodiments, at least one of the plurality of shield collar apertures is smaller than at least one of the plurality of gas injector tube apertures. In some embodiments, the larger gas injector tube aperture is at least partially aligned with the smaller shield collar aperture. An at least partial alignment means that when fluid flows through the larger gas injector tube aperture, a portion of the fluid would also flow through an adjacent shield collar aperture and the shield collar gap. Accordingly, in such configurations, gas may flow through both of the at least partially aligned apertures.

Upon exit of the gas injector tube and entry into the shield collar aperture, there may be a pressure change due to the change in aperture size. In addition, the total surface area of the shield collar apertures may be larger than the total surface area of the gas injector tube apertures. The larger surface area of the gas injector tube apertures means the total flow through each shield collar is determined by the gas injector tube apertures. The larger size gas injector tube aperture may clog less frequently after multiple uses, and the variation of total gas flow through each shield collar over multiple uses m ay also be less than in conventional systems. The size of the shield collar aperture and the gap may be selected to achieve optimum flow characteristics based upon the particular substrate, the gas used, the amount of gas, and/or the amount of flow through the gap to be directed substantially perpendicular to the flow direction of the apertures.

In various embodiments, the alignment of the apertures is such that the apertures are coaxial to each other or substantially coaxial to each other, although any amount of overlap of the apertures such that would allow gas flow through both apertures is contemplated. As used herein, a collar aperture corresponds to a tube aperture when the collar aperture is located to at least partially overlap the corresponding tube aperture when the gas injector tube and the shield collar are coupled. For example, shield collar 300 may couple with gas injector tube 301 such that shield collar apertures 305 substantially align with gas injector tube apertures 304. In this manner, gas may flow through the larger tube apertures and the smaller shield collar apertures and shield collar gap.

As noted above, an end cap or flanged sleeve may be used at one or both terminals of a gas injector tube. For an embodiment, an end cap includes any component that seals one terminus of a gas injector tube. A flanged sleeve includes any component used for input of gas and/or for attachment to hold or orient the gas injector tube. An end cap or flanged sleeve may be constructed of any material suitable for constructing a gas injector tube. For example, in various embodiments, an end cap and flanged sleeve are made of graphite.

An end cap may have an interior portion that extends into the terminus of a gas injector tube. In embodiments where cylindrical gas injector tubes are used, the end cap may include an interior portion that is the same diameter as the inside diameter of the gas injector tube. End cap 306 is shown in FIG. 3A. An end cap's interior portion may further comprise pin apertures 307.

Figure 4:
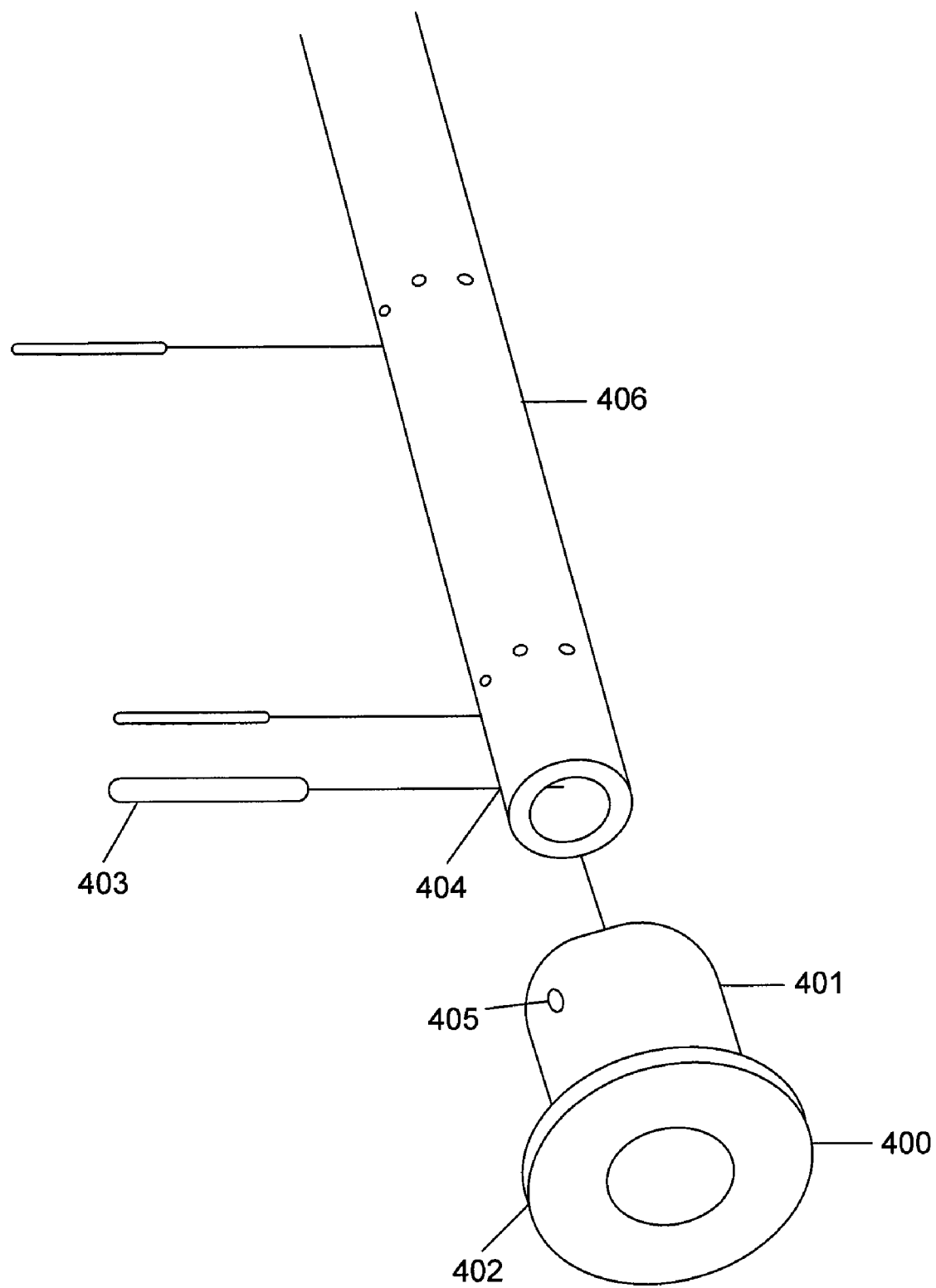
FIG. 4 illustrates a gas injector tube with a separate flanged sleeve in accordance with an embodiment.
Figure 6A:
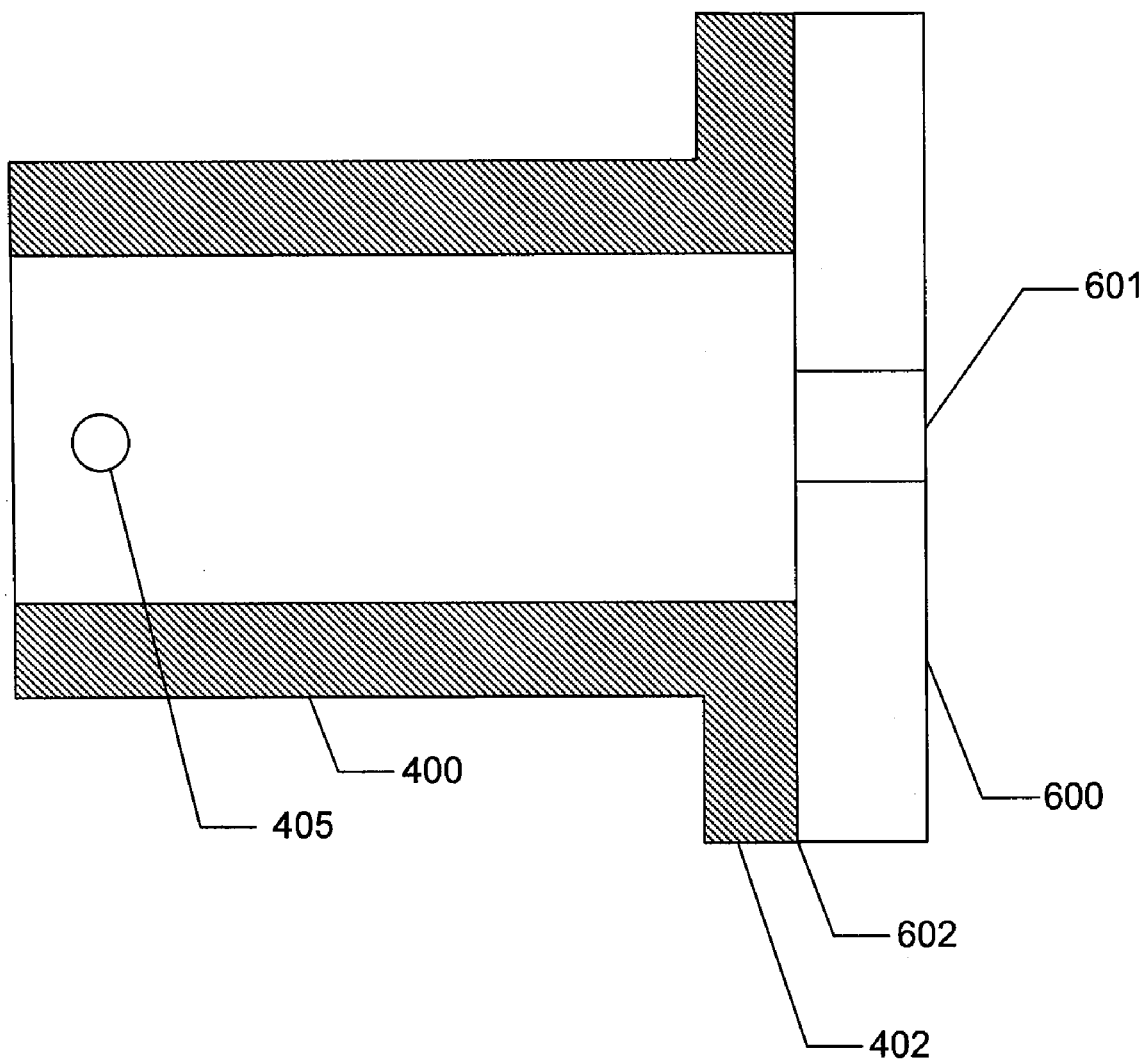
FIG. 6A illustrates a gas injector tube coupled with an end flange in accordance with an embodiment.

An end cap or flanged sleeve may also include a flange portion. In embodiments where cylindrical gas injector tubes are used, the end cap's flange portion or a flanged sleeve may be of the same or greater diameter as the outside diameter of the gas injector tube. In such embodiments, a flanged sleeve may accept a terminus of a gas injector tube within the inside of the sleeve. Flanged sleeve 400 is shown in FIG. 4 having a sleeve portion 401, flange portion 402, and pin aperture 405. Carbon foil may be used at an end cap and gas injector tube joint or between a flanged sleeve and other components. For example, carbon foil may be placed at an interface between the flange portion 402 of the flanged sleeve 400 and a plate 900 and 1000 shown in FIG. 9 and FIG. 10. Also for example, carbon foil may be placed at interface 602 between the flanged sleeve and an end flange 600. An end flange may have an aperture 601. As shown in FIG. 6A, the aperture 601 may be any size equal or smaller than the inside of flanged sleeve 400. The total gas flow to gas injector tube 406 may be determined by aperture 601.

Figure 6B:
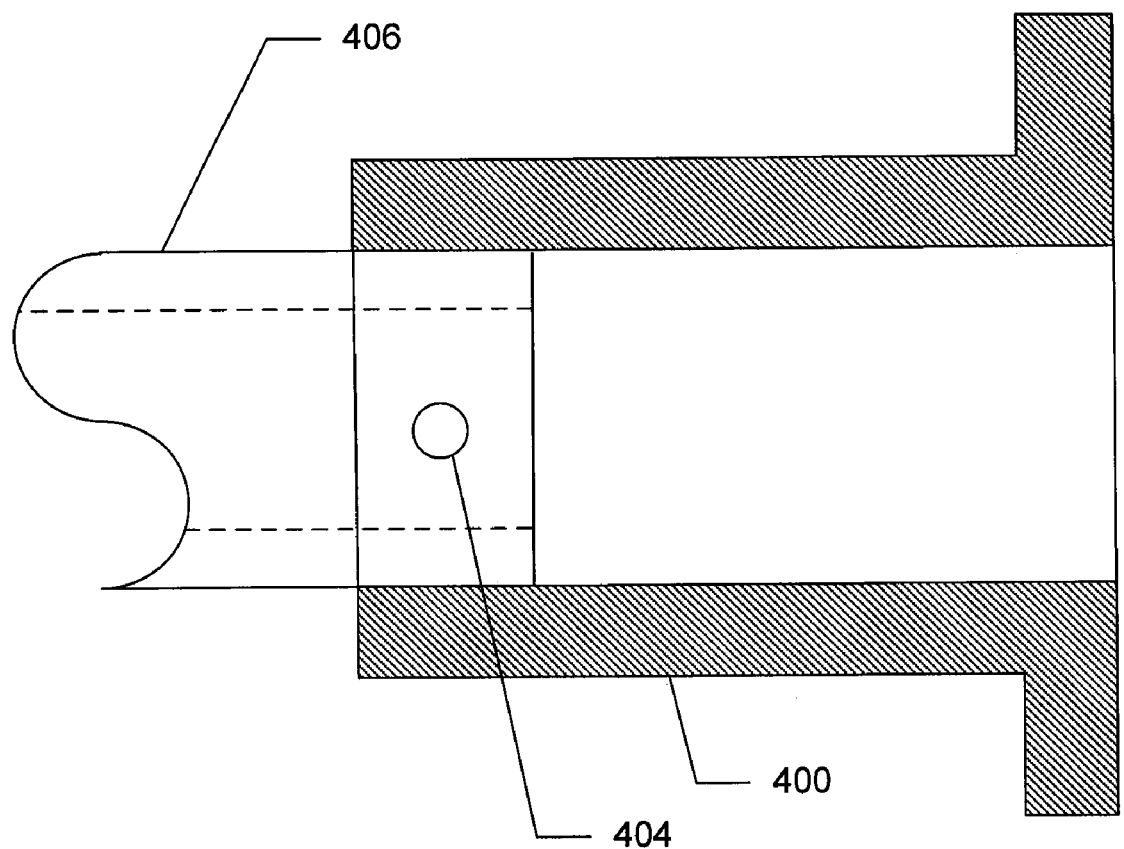
FIG. 6B illustrates a gas injector tube coupled with a flanged sleeve in accordance with an embodiment.
Figure 7A:
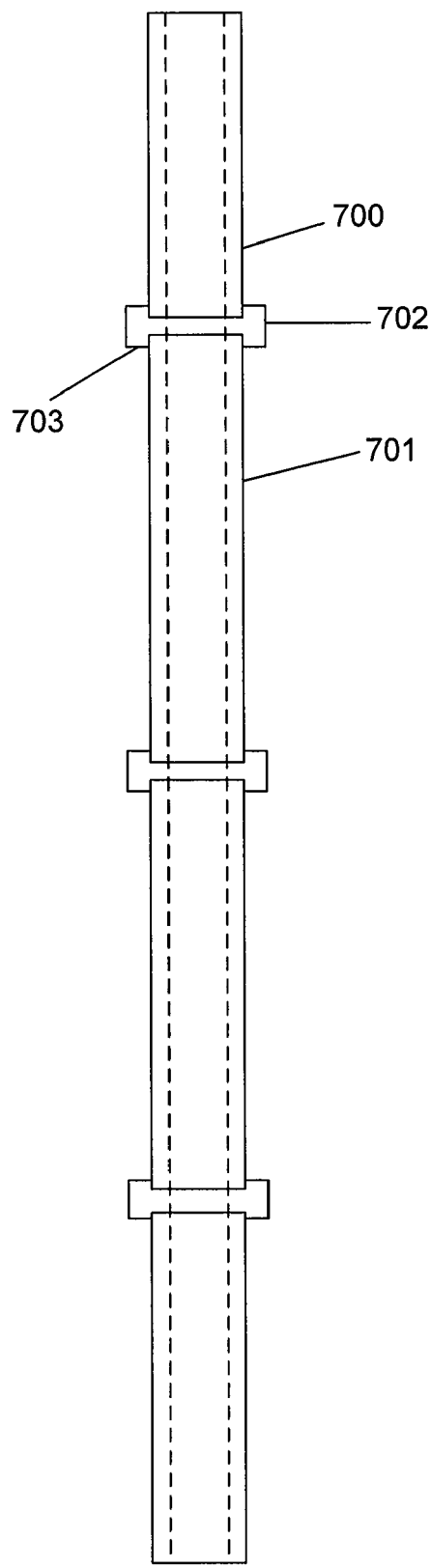
FIGS. 7A,7B, and 7C illustrate gas injector tubes and shield collars in accordance with an embodiment.
Figure 7B:
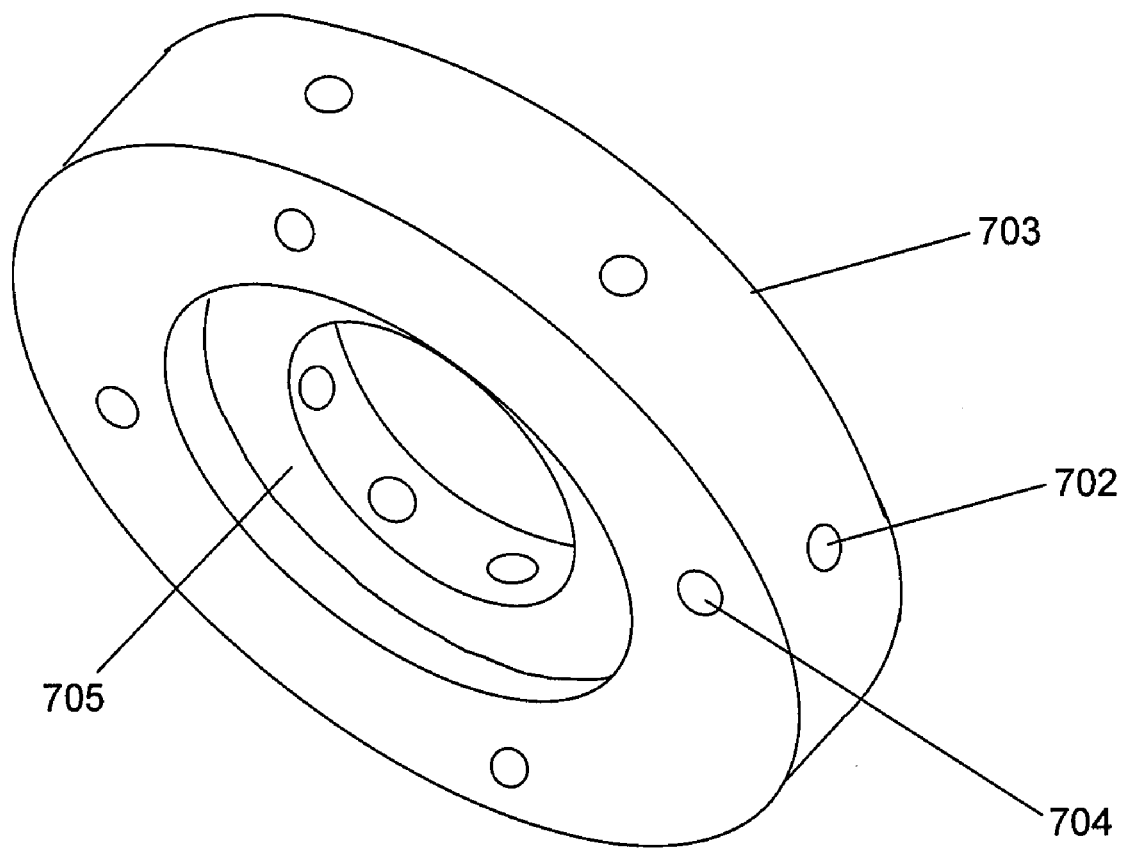
Figure 7C:
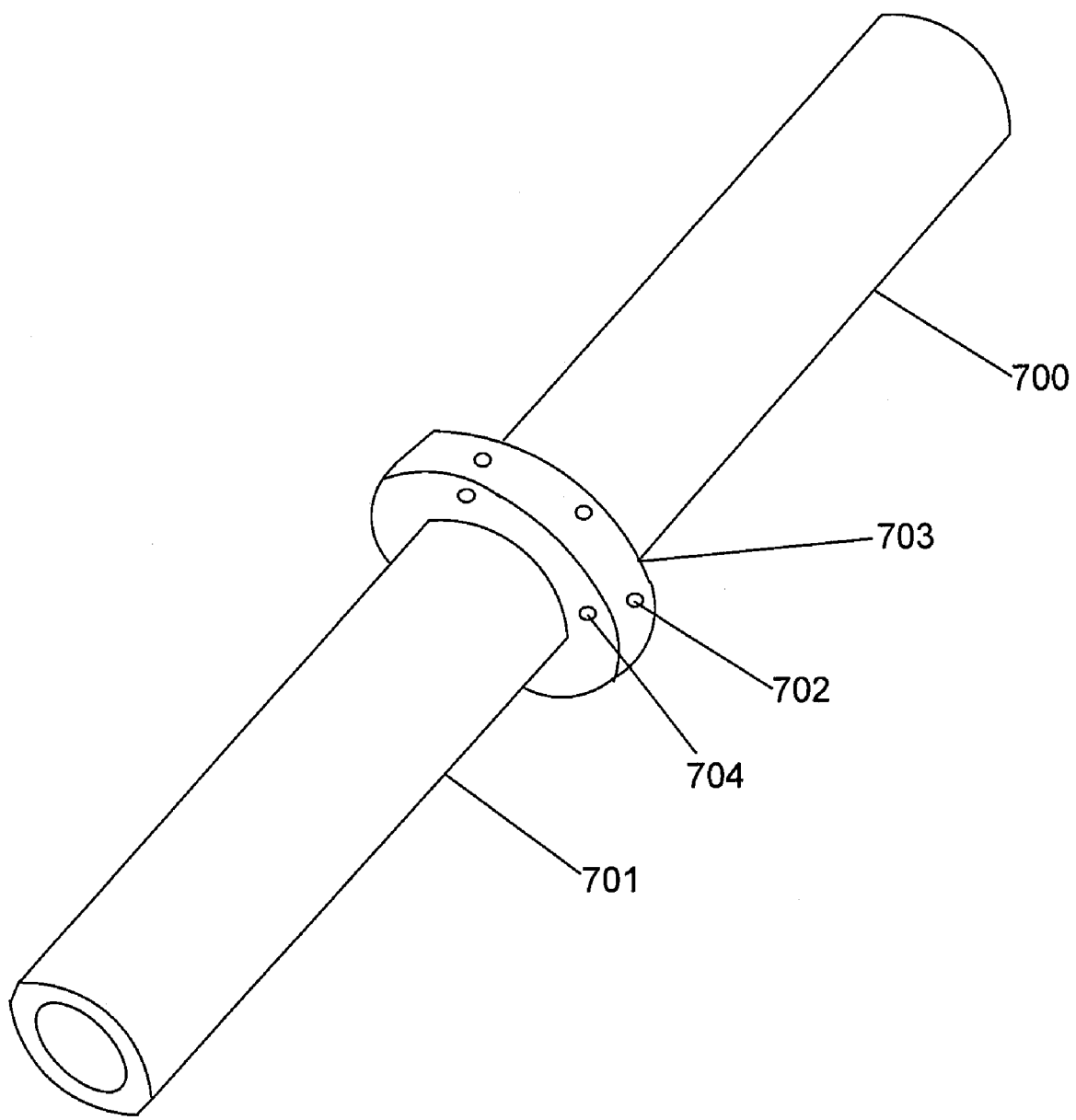

An end cap or flanged sleeve may be secured to a gas injector tube. Any suitable method of securing an end cap or flanged sleeve to the gas injector tube may be used. For example, bonding materials, such as glue, epoxy, or various carbon materials may be used to couple the end cap or flanged sleeve to the gas injector tube. In various embodiments, one or more pins may be used to couple an end cap or flanged sleeve to the gas injector tube. Such pins may be constructed of any material suitable for constructing a gas injector tube. In various embodiments, pins are made of graphite. Pins may be inserted through the end cap apertures on a gas injector tube and the pin apertures on an end cap. Pins may also be inserted through the flanged sleeve apertures 203 on a gas injector tube and the pin apertures on a flanged sleeve. For example, pin 403 may pass through gas injector tube aperture 404 and flanged sleeve aperture 405. With reference to FIGS. 6A and 6B, flanged sleeve apertures 404 and 405 are shown.

Figure 8A:
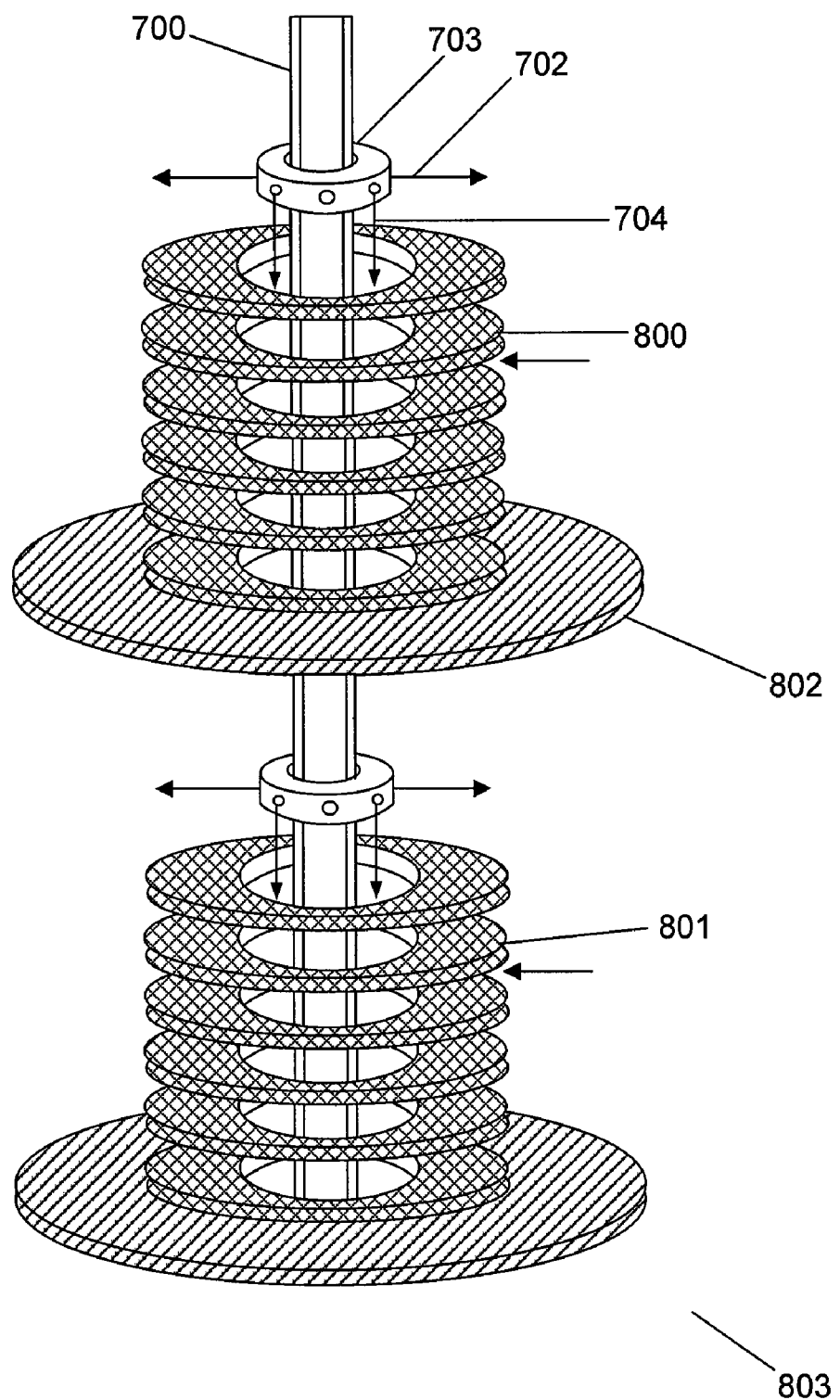
FIGS. 8A and 8B illustrate the interior of a vessel comprising various annular substrates in accordance with various embodiments.
Figure 8B:
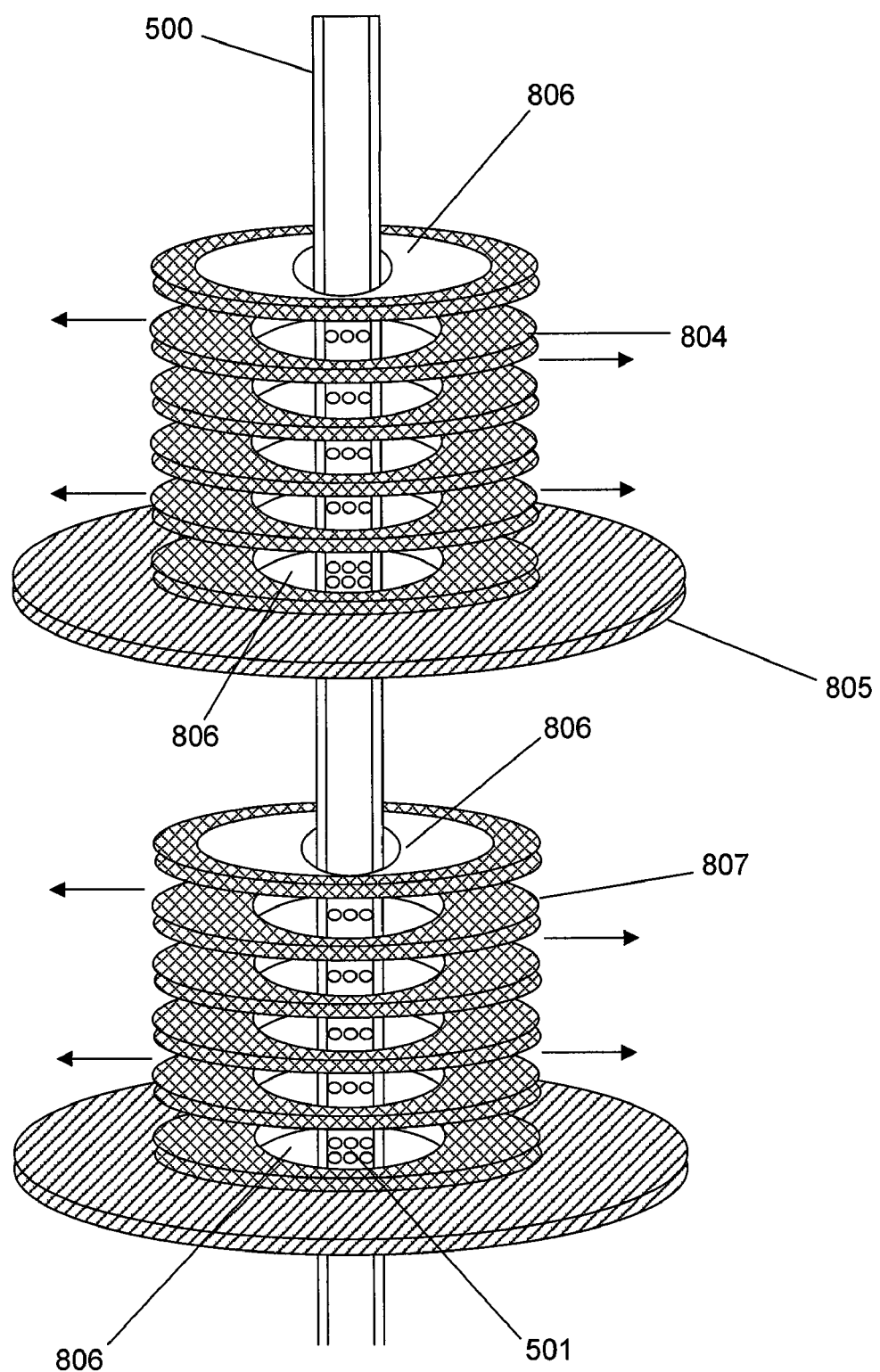
Figure 9:
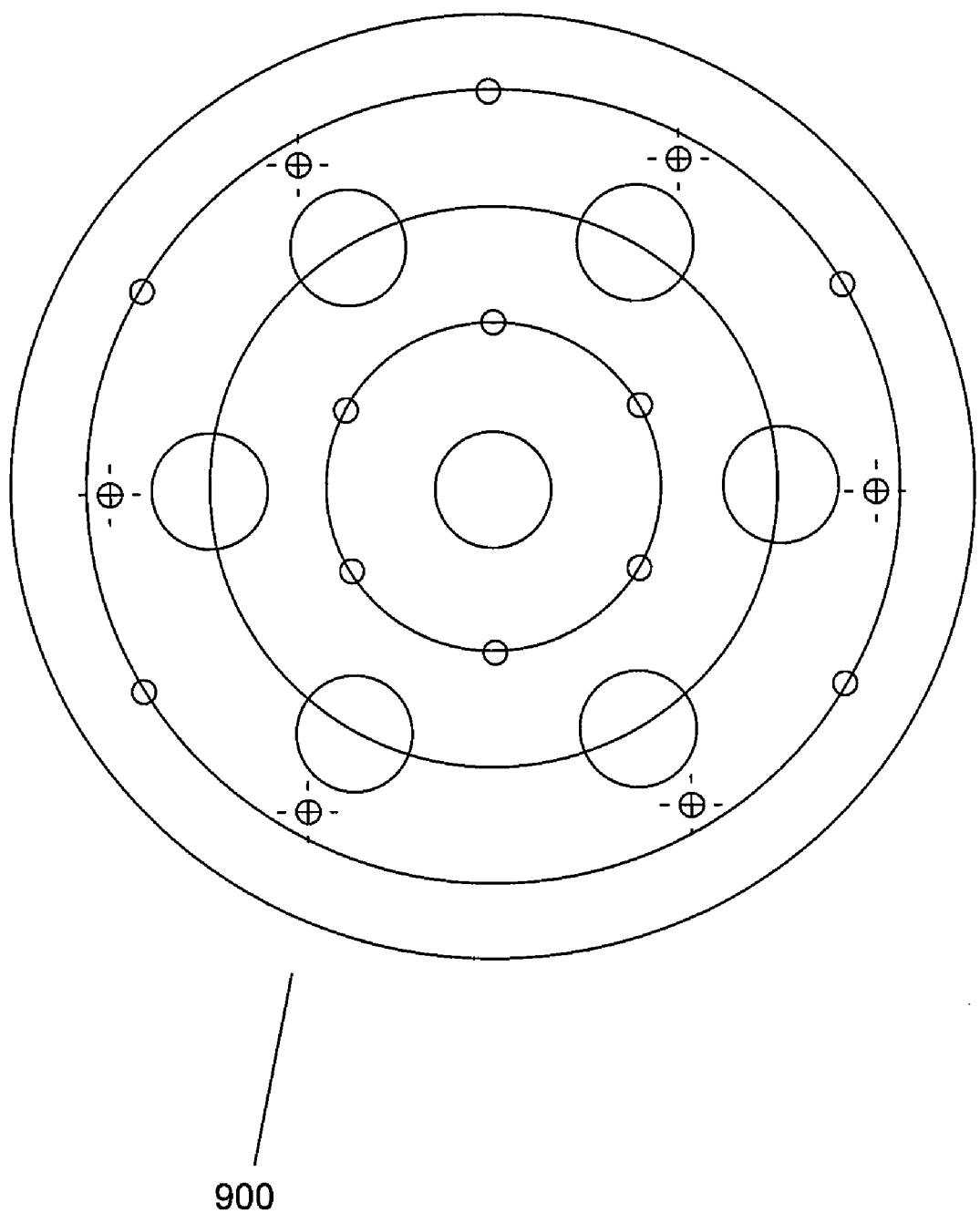
FIG. 9 illustrates a plate in accordance with an embodiment.
Figure 10:
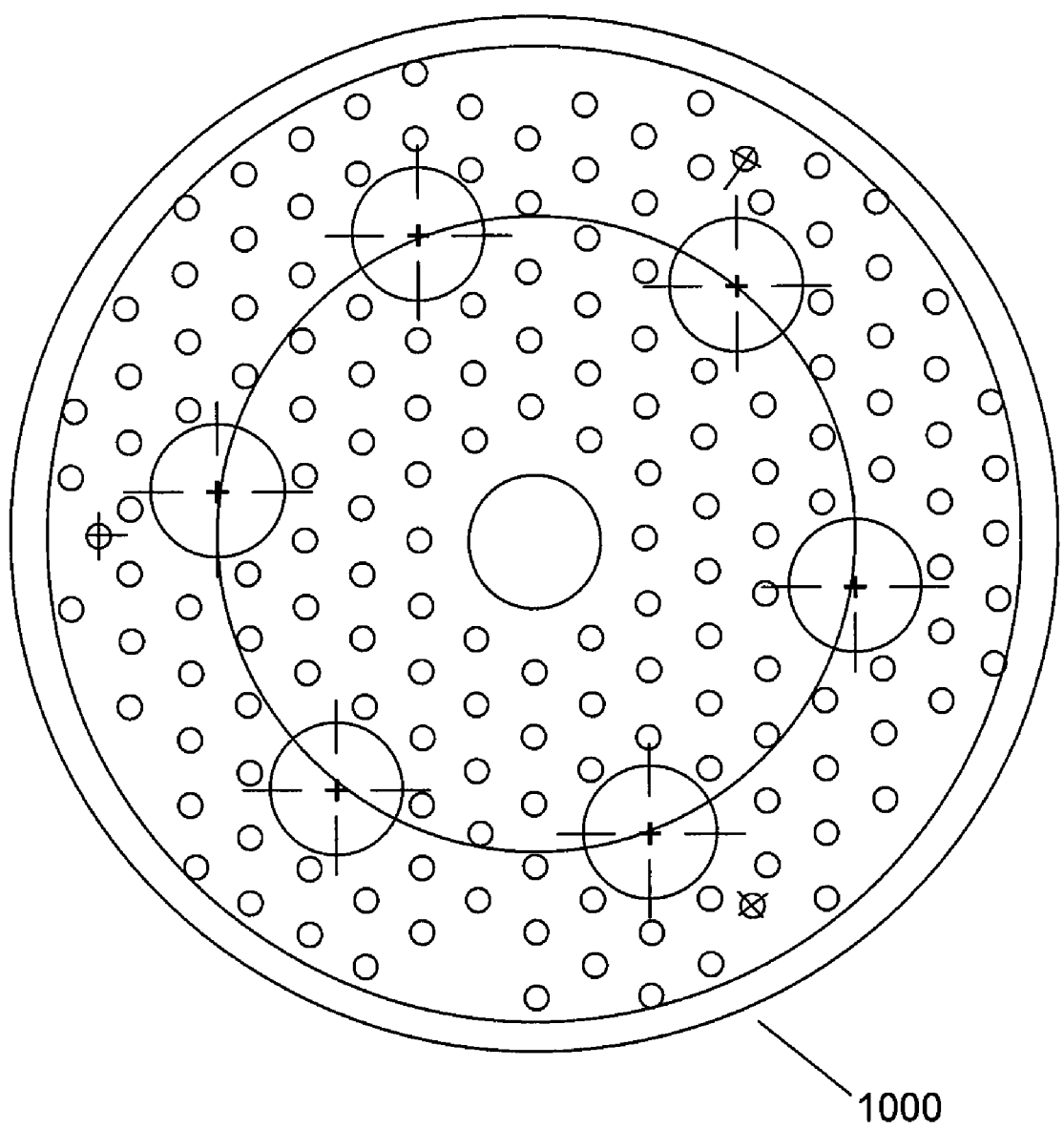
FIG. 10 illustrates plate with a different aperture configuration in accordance with an embodiment.
Figure 11A:
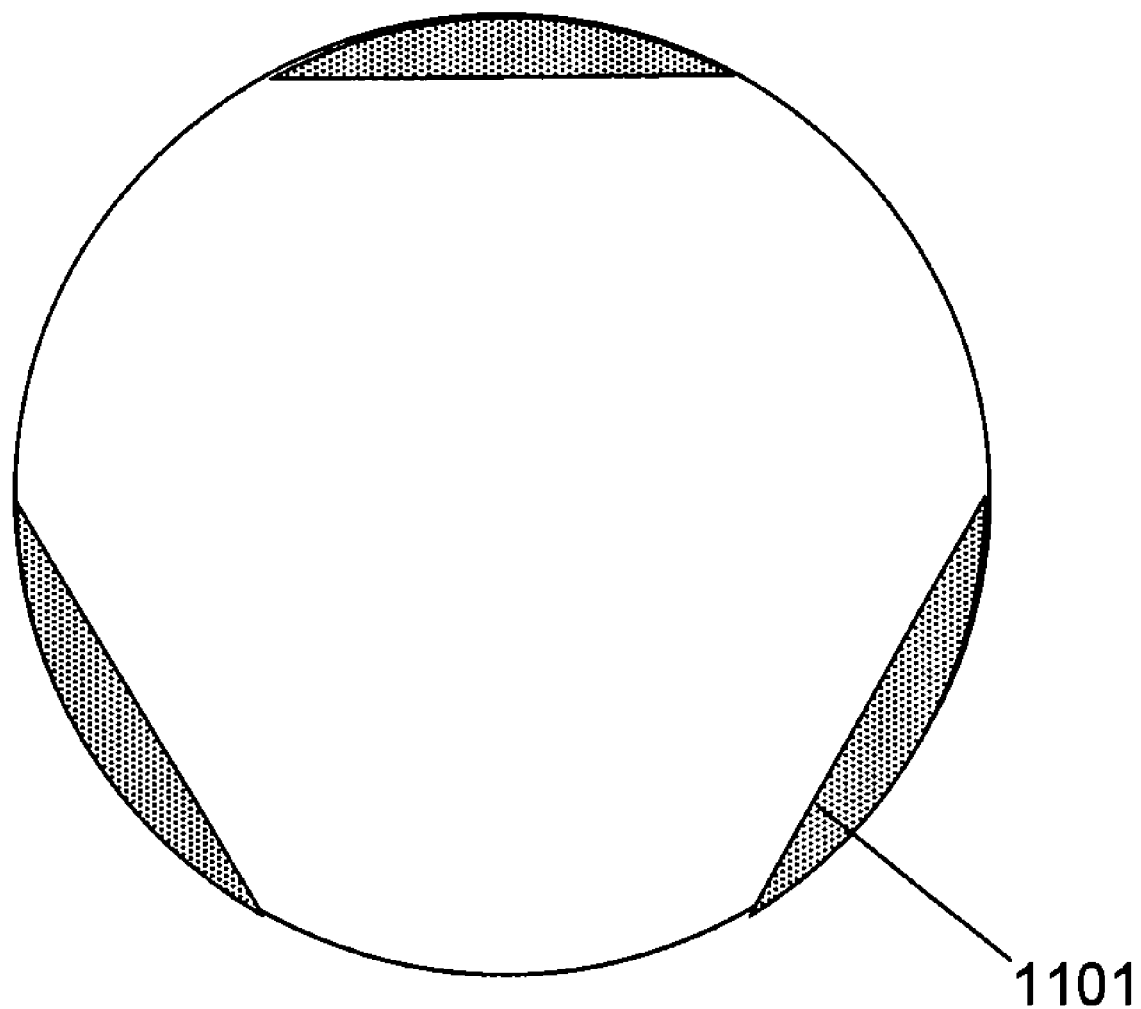
FIGS. 11A and 11B illustrate a gas injector chamber in accordance with an embodiment.
Figure 11B:
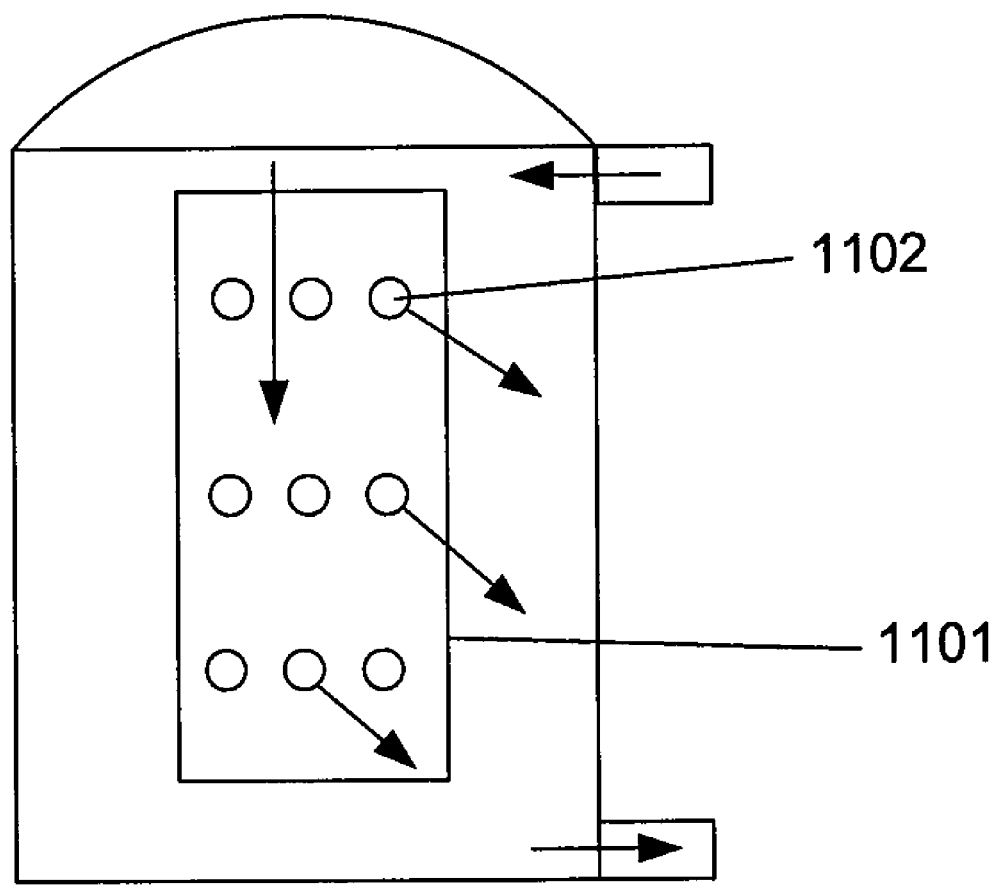

In various embodiments, one or more gas injector tubes are coupled into a single assembly. For example, two gas injector tubes may be aligned coaxially or partially overlapping. One terminus of each gas injector tube may be coupled to a shield collar. When coupled, a gap between each injector tube may be provided to allow gas to flow through the shield collar. For example, with reference to FIG. 7A, 7B, and 7C, gas injector tubes 700 and 701 may be disposed substantially coaxial and coupled using shield collar 703. When coupled, the terminuses of gas injector tubes 700 and 701 form a gap within the shield collar, allowing gas to flow through the gap and through the shield collar apertures 702 and 704. Shield collar 703 may be used in such embodiments. Shield collar 703 has collar aperture 702 and collar aperture 704 which are positioned substantially perpendicular relative to each other. Shield collar 703 also includes step down 705. To couple, a terminus of gas injector tube 700 may be positioned on or within step down 705. FIG. 8A illustrates an embodiment having one or more gas injector tubes coupled into a single assembly 700 and their relation to an exemplary substrate. FIG. 8B illustrates an embodiment using injector 500 in relation to an exemplary substrate. Seal 806 may be disposed on top of a stack of substrates 804 and 807. Seal 806 may also be disposed on top of plates 805. Seal 806 may be made of any suitable material, including carbon foil and/or graphite. Plate 805 separates stack 804 and stack 807. Gas injector tube apertures 501 allow for fluid flow. The seals 806 force gas to flow substantially between individual substrates in 804 or in 807.

Chemical vapor material used in conjunction with various embodiments may be any gas having one or more components capable of decomposing to form a solid residue on or within a substrate. In various embodiments, gas comprises one or more reactant components and/or one or more carrier components.

The reactant component of a gas may be capable of forming a residue upon thermal decomposition. For example, when carbon is the desired residue (as in the formation of carbon/carbon composites), the reactant component may comprise one or more hydrocarbons. Suitable hydrocarbons include alkanes such as straight chain, branched chain and/or cyclic alkanes. The alkane may have, for example, from about 1 to about 8 carbon atoms, and more specifically, from about 1 to about 6 carbon atoms, and more specifically, from about 1 to about 3 carbon atoms. Examples of alkanes include methane, ethane, propane, cyclopentane, or mixtures thereof. In other embodiments, the reactant component may comprise one or more alkenes, having for example, about 2 to about 8 carbon atoms, alone or in addition to one or more alkanes. Further, borontrichloride and/or chlorosilanes such as methyltrichlorosilane or dimethyldicholorosilane may be used. Still further, silicon by using silane, silicon nitride by using silane and ammonia, or SiO2 may be deposited using oxygen, dichlorosilane, nitrous oxide, or tetraethylorthosilicate. Many metals may be deposited by CVD using chlorides, florides, or at low temperature by carbonyl precursors. These metals include but are not limited to rhenium, tungsten, molybdenum, tantalum, and nickel. Many organometallic compounds are in use for deposited metals, semiconductors, and ceramics. For example, GaAs CVD can be done with Arsine and trimethylgallium.

The carrier component includes a gas suitable to carry and/or dilute the reactant component. The carrier component may comprise hydrogen, nitrogen, helium, argon, or a mixture of two or more thereof. It will be understood that the carrier component may comprise any diluent and/or inert gases.

As used herein, a "substrate" includes materials capable of being treated by CVD/CVI. In various embodiments, a substrate comprises a porous material having sufficient pore size and volume to permit a gas to infiltrate the pores under reaction conditions to form a solid residue therein as a result of thermal decomposition. Examples of suitably porous materials include, for example, carbon, silicon, boron, silicon carbide, silicon nitride, aluminum nitride, titanium nitride, boron carbide, cubic zirconia and the like, or a mixture of two or more thereof.

In accordance with various embodiments, the porous material is formed from a fibrous material, such as carbon fibers and the like. The carbon fibers may be derived from polyacrylonitrile, rayon (synthetic fiber derived from cellulose), pitch and the like. In an embodiment, the porous substrate is formed by twisting together or otherwise joining the fibers to form a fiber yarn. The yarn may be woven, braided, knitted or otherwise joined into layers of fibrous material. These layers are then combined to form a porous substrate.

In various embodiments, the substrate comprises a substantially solid material. For example, composite materials may be used as substrates in CVD. However, it will be understood that a substrate may comprise any material (whether porous or solid) that is capable of being treated by CVI and/or CVD.

The substrate may comprise any desired shape or form. For example, the substrate may be in the form of a polygon, such as a triangle, a square, rectangle, pentagon, hexagon, octagon, and the like. Similarly, the substrate may be other shapes, including symmetrical and asymmetrical shapes. In various embodiments, the substrate may be in the form a circular or annular disk.

In various embodiments, a stack of substrates are grouped together in several groups and arranged in the vessel such that each group is separated by a plate. The plates used may be solid or they may have a variety of apertures that may allow gas to permeate through the plate. The substrates may be separated, for example using spacers, or they may be stacked surface to surface. In some embodiments, substrates are stacked surface to surface, meaning that substrates are stacked in couples such that one surface of each substrate is in contact with each other. In such a configuration, only one surface of each substrate will have the vapor material deposited onto it.

For example, with reference to FIG. 8A, 8B, vessel 803 contains two stacks of substrates 800, 801, 804 and 807. The stacks 800 and 801 are separated by plate 802. Plate 802 may be constructed of any material capable of withstanding CVD/CVI operating temperatures and pressures. Plate 802 may lack apertures or may have apertures disposed in any pattern, such as depicted in plate 900 and plate 1000. Gas injector tube 700 is coupled to shield collar 703. Shield collar 703 may have apertures 702 and 704 to allow gas to flow both horizontally and vertically through and over the stack Gas injector tube 700 can be of a type shown in FIG. 3. Gas injector tube 301 is coupled to shield collar 300. The apertures 305 and gap 102 allow gas to flow both horizontally and vertically through and over the stack. In such a configuration, substrate coating may be directionally controlled, allowing for improved deposition of material. Moreover, the use of shield collars may extend the useful life of the gas injector tube.

Figure 5:
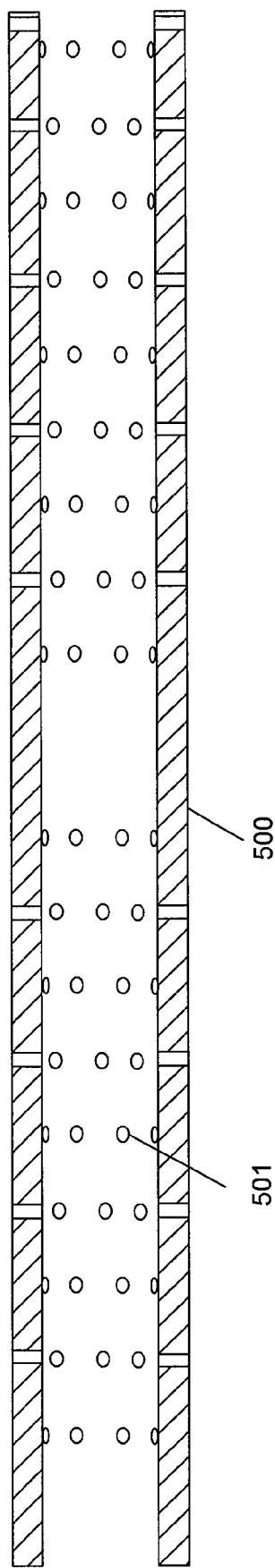
FIG. 5 illustrates a gas injector tube in accordance with an embodiment.

With reference to FIGS. 8B and 5, gas injector tube 500 may have apertures 501 aligned with the inside of stacks of substrates. Two stacks of substrates 804 and 807 are shown. The stacks 804 and 807 are separated by plate 805. Plate 805 may be constructed of any material capable of withstanding CVD/CVI operating temperatures and pressures. Plate 805 may lack apertures or may have apertures disposed in any pattern, such as depicted in plate 900 and plate 1000. The top and bottom of the stacks of substrates may be partially or completely sealed with an appropriate sealing component comprised of other material capable of withstanding CVD/CVI operating temperatures and pressures. Sealing components may be made of various carbon based materials and may assume various geometries. For example, sealing component 806 is a disk made of graphite. Seal 806 is disposed on top of a stack of substrates 804 and 807. In addition, seal 806 is placed on plates 805 below the stack of substrates 804 and 807. The gas flow may be focused out from the center and between the substrates separated by spacers.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the invention. The scope of the invention is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method comprising the steps of:
   forming a gas injector tube having a tube aperture radially disposed through a wall of said gas injector tube;
   forming a shield collar having a collar aperture at least partially radially corresponding to said tube aperture, wherein said shield collar is configured such that said tube aperture at least partially aligns with said collar aperture, wherein said tube aperture is larger than said collar aperture; and
   coaxially coupling said shield collar with said gas injector tube.

2. The method of claim 1, wherein said shield collar comprises a perpendicular collar aperture configured to direct gas flow perpendicular to said collar aperture.

3. The method of claim 1, wherein said gas injector tube has a plurality of tube apertures, Wherein said shield collar has a plurality of collar apertures and wherein the total surface area of said tube apertures is less than the total surface area of said collar apertures.

4. The method of claim 1, wherein said gas injector tube and said shield collar are comprised of a carbon material.

\* \* \* \* \*